(12) United States Patent
Kim

(10) Patent No.: US 7,400,525 B1
(45) Date of Patent: Jul. 15, 2008

(54) MEMORY CELL WITH INDEPENDENT-GATE CONTROLLED ACCESS DEVICES AND MEMORY USING THE CELL

(75) Inventor: Keunwoo Kim, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/622,172

(22) Filed: Jan. 11, 2007

(51) Int. Cl.
*G11C 11/00* (2006.01)
(52) U.S. Cl. .................................. 365/156; 365/205
(58) Field of Classification Search ............... 365/156, 365/205
See application file for complete search history.

(56) References Cited

U.S. PATENT DOCUMENTS

| | | | |
|---|---|---|---|
| 6,266,278 B1 * | 7/2001 | Harari et al. | 365/185.18 |
| 6,344,993 B1 * | 2/2002 | Harari et al. | 365/185.01 |
| 6,982,897 B2 * | 1/2006 | Luk et al. | 365/149 |
| 2002/0145159 A1 * | 10/2002 | Ishii et al. | 257/296 |
| 2005/0237786 A1 * | 10/2005 | Atwood et al. | 365/156 |

OTHER PUBLICATIONS

Nowak et al., "A Functional FinFET-DGCMOS SRAM Cell," Tech. Dig., pp. 411-414 (Dec. 2002).
Liu et al., "A High Threshold Voltage-Controllable 4T FinFET with an 8.5-nm-Thick Si-Fin Channel," IEEE Elec. Dev. Lett., vol. 25, No. 7, pp. 510-512 (Jul. 2004).
Chiang et al., "Novel High-Density Low-Power High-Performance Double-Gate Logic Techniques," Proc. IEEE Internat. SOI Conf. (Oct. 2004).
Yamaoka et al., "Low-Power SRAM Menu for SOC Application Using Yin-Yang-Feedback Memory Cell," Symp. VLSI Circuits Dig., pp. 288-291 (Jun. 2004).
Guo, Z., "FinFET-Based SRAM Design," Proc. Internat. Symp. Lower Power Elec. Des., pp. 2-7 (Aug. 2005).
"MEDICI: 2-D Device Simulation," Synopsys Inc., Mountain View, CA, http://www.synopsys.com/products/mixedsignal/taurus/device_sim_ds.html, Mar. 2004.

* cited by examiner

*Primary Examiner*—Michael T Tran
(74) *Attorney, Agent, or Firm*—Ryan, Mason & Lewis, LLP

(57) ABSTRACT

A memory cell includes double-gate first and second access devices configured to selectively interconnect cross-coupled inverters with true and complementary bit lines. Each access device has a first gate connected to a READ word line and a second gate connected to a WRITE word line. During a READ operation, the first and second access devices are configured to operate in a single-gate mode with the READ word line "ON" and the WRITE word line "OFF" while the double-gate pull-down devices are configured to operate in a double gate mode. During a WRITE operation, the first and second access devices are configured to operate in a double-gate mode with the READ word line "ON" and the WRITE word line also "ON".

16 Claims, 7 Drawing Sheets

MEMORY CELL WITH INDEPENDENT-GATE CONTROLLED ACCESS DEVICES AND MEMORY USING THE CELL

STATEMENT REGARDING FEDERALLY SPONSORED RESEARCH OR DEVELOPMENT

This invention was made with Government support under contract number NBCH 3039004 awarded by the Defense Advanced Research Projects Agency (DARPA). The government has certain rights in this invention.

FIELD OF THE INVENTION

The present invention generally relates to electronic circuitry and, more particularly, to electronic memory circuits.

BACKGROUND OF THE INVENTION

Static random access memories (SRAMs) are important components in microprocessor chips and applications, and the portion of SRAM arrays in the total chip area has continued to increase. As devices are scaled down, process variations, including device random fluctuations, are key factors in SRAM design. Furthermore, devices in SRAM cells are being aggressively scaled in terms of device width (or other characteristic dimension) to reduce the area. The smaller cell area aggravates random statistical fluctuations, and hence stable SRAM design is more challenging and complex as silicon technology is advanced.

SRAM cells can be quite unstable in READ operations, since the data in the storage node is disturbed by the READ current, which can flip the logic values in the storage nodes VL, VR FIG. 1 shows a READ operation in a prior-art SRAM cell 100. The voltage on node VR rises above zero to a voltage determined by the resistive voltage divider for the access devices 102, 104 (AL and AR) and pull-down devices 106, 108 (NL and NR). Hence, wider pull-down devices 106, 108 (NL and NR) relative to access devices 102, 104 (AL and AR) must be used to improve the READ margin (or to achieve a successful and reliable READ operation). The construction and operation of conventional cell 100, including true and complementary bit lines 110, 112; word line 114, and transistors 116, 118 (PL and PR) is well-known to the skilled artisan.

The WRITE operation is also very unstable in prior-art cells due to increased process variations. FIG. 2 shows a WRITE operation in the prior-art SRAM cell 100 (elements in FIG. 2 similar to those in FIG. 1 are designated by the same reference characters). In the WRITE operation, devices 102, 116 (AL and PL) (or devices 104, 118 (AR and PR)) form a resistive voltage divider for the lower-voltage bit line 110 (BL) and the node (VL) having a logical "one" stored therein. In this case, device 102 (AL) (or device 104 (AR)) must be stronger than device 116 (PL) (or device 118 (PR)) to improve the WRITE margin (that is, to enable a quick exchange of the state of the stored data between the two cell nodes, NL and VR).

Double-gate (DG) complementary metal oxide semiconductor (CMOS) devices offer distinct advantages for sealing, due to much reduced short-channel effects, and DG CMOS also offers the opportunity to proceed beyond the performance of single-gate (SG) devices such as bulk silicon or silicon-on-insulator (SOI). A variety of DG device structures including FinFET, TriGate, and gate-all-around field effect transistors (FETs) are proposed. Among these, the FinFET is quite promising due to its easy fabrication and process flow, and its superior performance FIG. 3 shows a FinFET device structure and FIG. 4 shows a cross-sectional view, as known from E. J. Nowak, et al., "A Functional FinFET-DGCMOS SRAM Cell," IEDM Tech. Dig., pp. 441-414, Dec. 2002. A FinFET device 300 can include multiple fins forming sources 302 and drains 304 with a central gate structure 306; as best seen in the insets in FIG. 3, first and second (or front and back) gates 307, 308 are formed for each fin. As best seen in FIG. 4, device parameters include the oxide thickness for the front and back gates, $t_{oxf}$ and $t_{oxb}$, and the dimension between the gate $t_{Si}$. Each gate controls a separate channel.

Interestingly, DG FinFET devices can be employed either with two gates tied, as shown in FIG. 5, or independently-biased, as shown in FIG. 6, and as known from Y. Liu, et al., "A High Threshold Voltage-Controllable 4T FinFET with an 8.5-nm-Thick Si-Fin Channel, IEEE Elec. Dev. Lett., Vol. 25, No. 7, pp. 510-512, July 2004, and Chiang, et al., "Novel High-Density Low-Power High-Performance Double-Gate Logic Techniques," Proc. IEEE Internat SOI Conf., Charleston, S.C. Oct. 2004. Similar elements in FIGS. 3 through 6 have received the same reference characteristics.

One way to improve SRAM READ/WRITE margins is to use the just-mentioned independently-controlled gates. Reference should now be had to FIGS. 7 and 8, wherein elements similar to FIGS. 1 and 2 have received the same reference character incremented by six hundred (FIG. 7) and seven hundred (FIG. 8); note that double-gate FETs are depicted in FIGS. 7 and 8. Yamaoka developed a "Yin-Yang" feedback technique for SRAM cells to improve the READ stability, as shown in FIG. 7 and as known from M. Yamaoka, et al., "Low-Power SRAM Menu for SOC Application Using Yin-Yang-Feedback Memory Cell," Symp. VLSI Circuits Dig., pp. 288-291, June 2004. The main drawback of the device of FIG. 7 is that the WRITE margin cannot be improved due to the reduction of the strength for the access devices 702, 704, because the access devices are in a single-gate (SG) mode of operation (back gates grounded) for the "Ying-Yang" scheme. Guo developed a scheme to connect the back gate of the access device and the corresponding storage node, as shown in FIG. 8 and as known from Z Guo, "FinFET-Based SRAM Design," Proc. Internat Symp. Lower Power Elec. Des., pp. 2-7, Aug. 2005. The back gate of device 802 is connected to left-hand node 890 and that of device 804 is connected to right-hand node 892. However, the scheme of FIG. 8 exhibits several drawbacks. First, the WRITE margin is not improved because both access devices 802, 804 and pull-up devices 816, 818 are in DG device mode during the WRITE operation, where the strength of the access device relative to the pull-up device is not improved, just as in the scheme of FIG. 7. Second, in a half-selected WRITE mode, the scheme of FIG. 8 has a serious problem due to the unwanted large leakage current flow from the storage node (storing a logical "one") to the bit line (at ground voltage) because the back gates are biased to VDD. Under conditions of increased threshold voltage (Vt) variation, WRITE operations will be unstable for this scheme.

In summary, for prior art cells, the conventional scaled 6T cell of FIGS. 1 and 2 is not stable; in the schemes of FIGS. 7 and 8, the WRITE margin is not improved; and writing is unstable in the half-selected case for the scheme of FIG. 8. It would be desirable to overcome or more of the limitations in previous approaches.

SUMMARY OF THE INVENTION

Principles of the present invention provide techniques for memory cells with independent-gate controlled access devices, and memories using the cells. One or more embodiments of cells according to the present invention can obtain improved READ and/or WRITE margins.

In an exemplary embodiment, according to one aspect of the invention, a memory cell for interconnection with true and complementary bit lines and READ and WRITE word lines includes a first inverter having a first inverter double-gate pull-down device, and a second inverter having a second inverter double-gate pull-down device. The second inverter is cross-coupled to the first inverter to form a storage flip-flop. The cell further includes first and second access devices configured to selectively interconnect the cross-coupled inverters with the true and complementary bit lines. The first and second access devices are double-gate devices, each having a first gate connected to the READ word line and a second gate connected to the WRITE word line. During a READ operation, the first and second access devices are configured to operate in a single-gate mode with the READ word line "ON" and the WRITE word line "OFF" while the double-gate pull-down devices are configured to operate in a double gate mode. During a WRITE operation, the first and second access devices are configured to operate in a double-gate mode with the READ word line "ON" and the WRITE word line also "ON." Optionally, the cell includes first and second inverter double-gate pull-up devices configured to operate in a double-gate mode during both the READ and WRITE operations.

In another aspect, an exemplary embodiment of a memory circuit includes a plurality of bit line structures, the bit line structures in turn comprising true and complementary bit lines, a plurality of word lines structures, the word line structures in turn comprising READ and WRITE word lines and intersecting the plurality of bit line structures to form a plurality of cell locations, and a plurality of cells, of the kind described, located at the plurality of cell locations. Each of the cells is selectively coupled to a corresponding one of the bit line structures under control of a corresponding one of the word line structures. The circuit further includes control circuit connected to the bit line structures and the word line structures and configured to activate the READ word line but not the WRITE word line during a READ operation, so that the first and second access devices operate in a single-gate mode while the double-gate pull-down devices operate in a double gate mode, and further configured to activate both the READ word line and the WRITE word line during a WRITE operation, so that the first and second access devices operate in a double-gate mode.

In yet another aspect, an exemplary method of operating a memory circuit of the kind described includes the steps of activating the READ word line but not the WRITE word line during a READ operation for a given on of the cells, so that the first and second access devices of the given one of the cells operate in a single-gate mode while the double-gate pull-down devices of the given on the cells operate in a double gate mode, and activating both the READ word line and the WRITE word line during a WRITE operation for the given one of the cells, so that the first and second access devices of the given one of the cells operate in a double-gate mode.

One or more embodiments of the present invention may be realized in the form of an integrated circuit.

These and other objects, features and advantages of the present invention will become apparent from the following detailed description of illustrative embodiments thereof, which is to be READ in connection with the accompanying drawings.

DETAILED DESCRIPTION OF PREFERRED EMBODIMENTS

Figure 1:
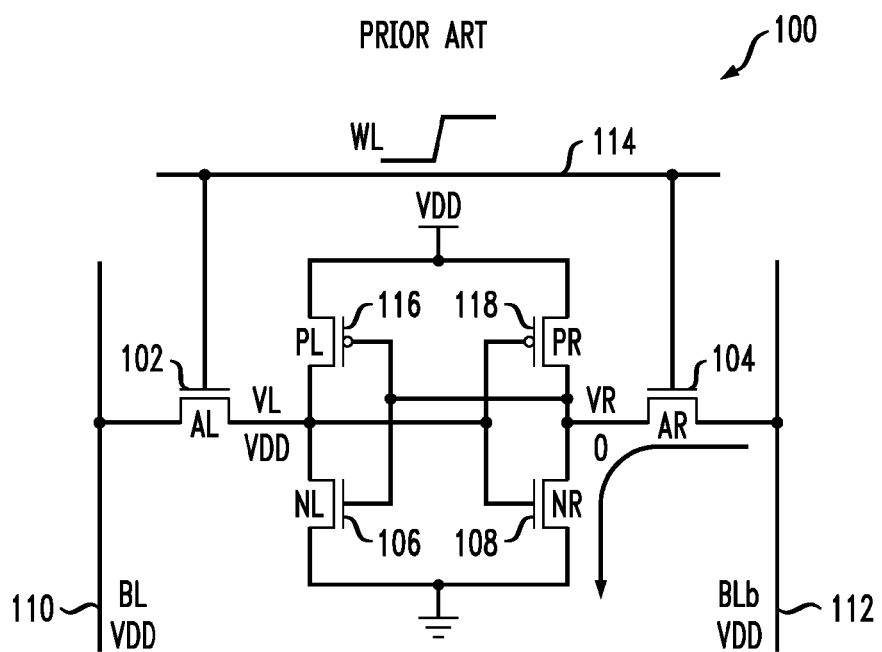
FIG. 1 shows a prior art cell during a READ operation.
Figure 2:
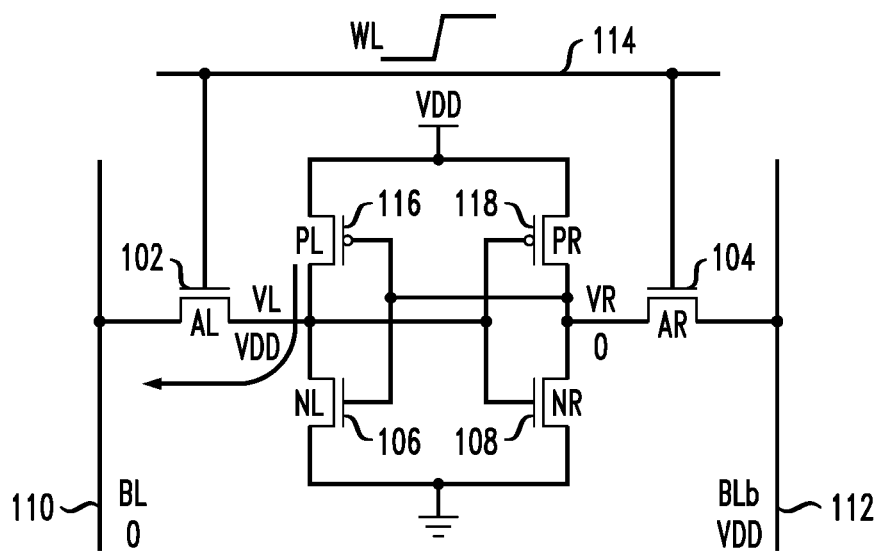
FIG. 2 shows a prior art cell during a WRITE operation.
Figure 3:
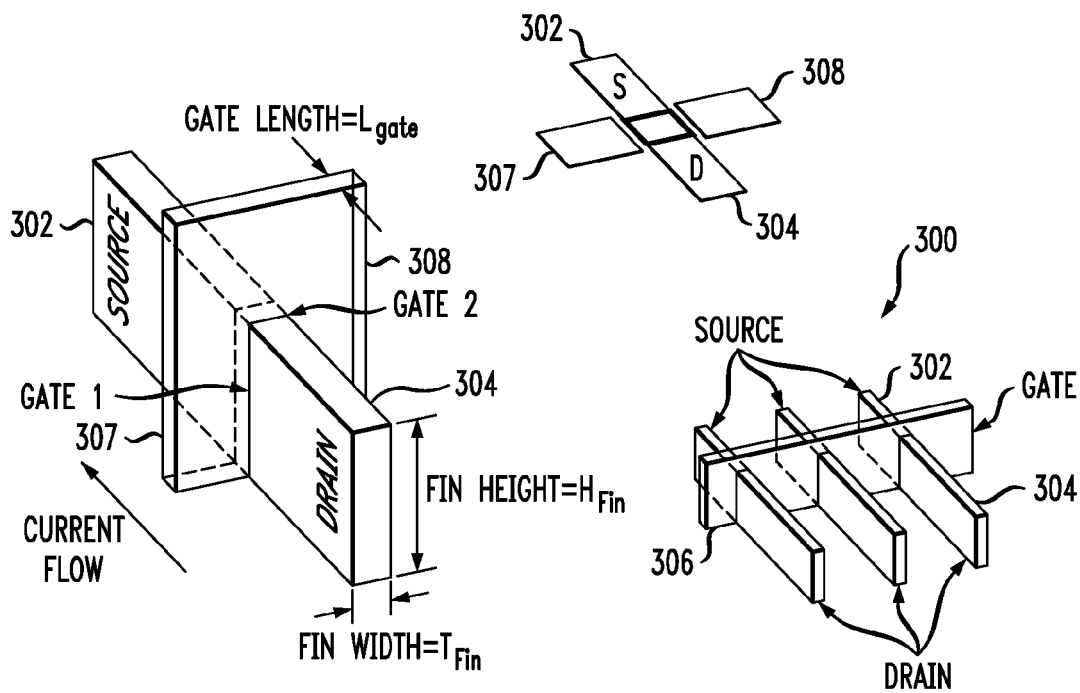
FIG. 3 shows a prior art FinFET device.

FIG. 1 depicts a memory, such as an SRAM, employing cells in accordance with an exemplary embodiment of the invention. It will be appreciated that cells 900 are part of the larger memory circuit having a plurality of bit line structures, such as those formed by true and complementary bit lines 902, 904. Such bit lines are also referred to as "BL" and "BLb." Further, the circuit also includes a plurality of word line structures, such as those formed by READ and WRITE word lines 906, 908 (also referred to as "RWL" and "WWL" respectively) that intersect the plurality of bit lines structures to form a plurality of cell locations. For illustrative convenience, only a single cell 900 is depicted in detail FIG. 1, the other cells being shown in block form. The skilled artisan will appreciate that a memory circuit can be provided, for example, in the form of an integrated circuit, having many such cells, as illustrated by the ellipses. Circuit 900 could, if desired, include some cells of the type shown in detail and some cells of a different type, either conventional or according to other embodiments of the present invention. Of course, all the cells could be identical.

A plurality of cells 900 can be located at the plurality of cell locations. Each of the cells 900 can be selectively coupled to a corresponding one of the bit lines structures formed by true and complementary bit lines 902, 904 under control of a corresponding one of the word line structures formed by READ and WRITE word lines 906, 908. Each of the cells can include a first inverter having a first inverter double-gate pull-down device 910 and a second inverter having a second inverter double-gate pull-down device 912. The second inverter is cross-coupled to the first inverter to form a storage flip-flop. Cell 900 further includes first and second access devices 914, 916 configured to selectively interconnect the cross-coupled inverters with the true and complementary bit lines 902, 904 of a corresponding one of the word line structures. The first and second access devices 914, 916 are double-gate devices, each having a first gate connected to the READ word line 906 and a second gate connected to the WRITE word line 908.

The circuit further includes control circuit 918 connected to the bit line structures and the word line structures and configured to activate the READ word line 906 but not the WRITE word line 908 during a READ operation, so that the first and second access devices 914, 916 operate in a single-gate mode while the double-gate pull-down devices 910, 912 operate in a double gate mode. Circuitry 918 is further configured to activate both the READ word line 906 and the WRITE, word line 908 during a WRITE operation, so that the first and second access devices 914, 916 operate in a double-gate mode. Circuitry 918 is shown in block form. It will be appreciated that the skilled artisan, given the teachings herein, will be able to construct appropriate control circuitry to carry out the indicated operations.

The first inverter can be formed, for example, from device 910 coupled to a first inverter pull-up device 920, and the second inverter can be formed, for example, from device 912 coupled to a second inverter pull-up device 922. In the exemplary embodiment depicted, the first inverter double-gate pull-down device 910 is an n-type field effect transistor (NFET) having electrically interconnected first and second gates, the first inverter pull-up device 920 is a p-type field effect transistor (PFET), the second inverter double-gate pull-down device 912 is an NFET having electrically interconnected first and second gates, and the second inverter pull-up device 922 is a PFET. Further, the first and second access devices 914, 916 can be double-gate NFETS, and the first and second inverter pull-down and pull-up devices 910, 920, 912, 922 and the first and second access devices 914, 916 can all have a substantially similar device dimension (such as area, width, or another appropriate device dimension).

The circuit can also include a supply voltage terminal 924 for a supply voltage VDD and a ground terminal 926, it being understood that terminal 926 need not necessarily be maintained at a potential of zero, and that the terminals 924, 926 may be appropriately interconnected with all the cells 900 as may be required. The first access device 914 has a first drain-source terminal connected to the true bit line 902, and a second drain-source terminal. The first inverter pull-up device 920 has a first drain-source terminal coupled to the supply voltage terminal 924, a second drain-source terminal coupled to the second drain-source terminal of the first access device 914, and at least one gate coupled to the first and second gates of the first inverter double-gate pull-down device 910. Further, the first inverter double-gate pull-down device 910 has a first drain-source terminal connected to the second drain-source terminal of the first inverter pull-up device 920 and a second drain-source terminal coupled to the ground terminal 926. The second access device 916 has a first drain-source terminal connected to the complementary bit line 904, and a second drain-source terminal. The second inverter pull-up device 922 has a first drain-source terminal coupled to the supply voltage terminal 924, a second drain-source terminal coupled to the second drain-source terminal of the second access device 916 and the at least one gate of the first inverter pull-up device 920, and at least one gate coupled to the first and second gates of the second inverter double-gate pull-down device 912 and the second drain-source terminal of the first inverter pull-up device 920.

The second inverter double-gate pull-down device 912 has a first drain-source terminal connected to the second drain-source terminal of the second inverter pull-up device 922 and a second drain-source terminal coupled to the ground terminal 926, and the first and second inverter pull-down and pull-up devices 910, 920, 912, 922 and the first and second access devices 914, 916 are all single-fin devices, such as FinFETs or vertical double-gate structure devices.

Figure 9:
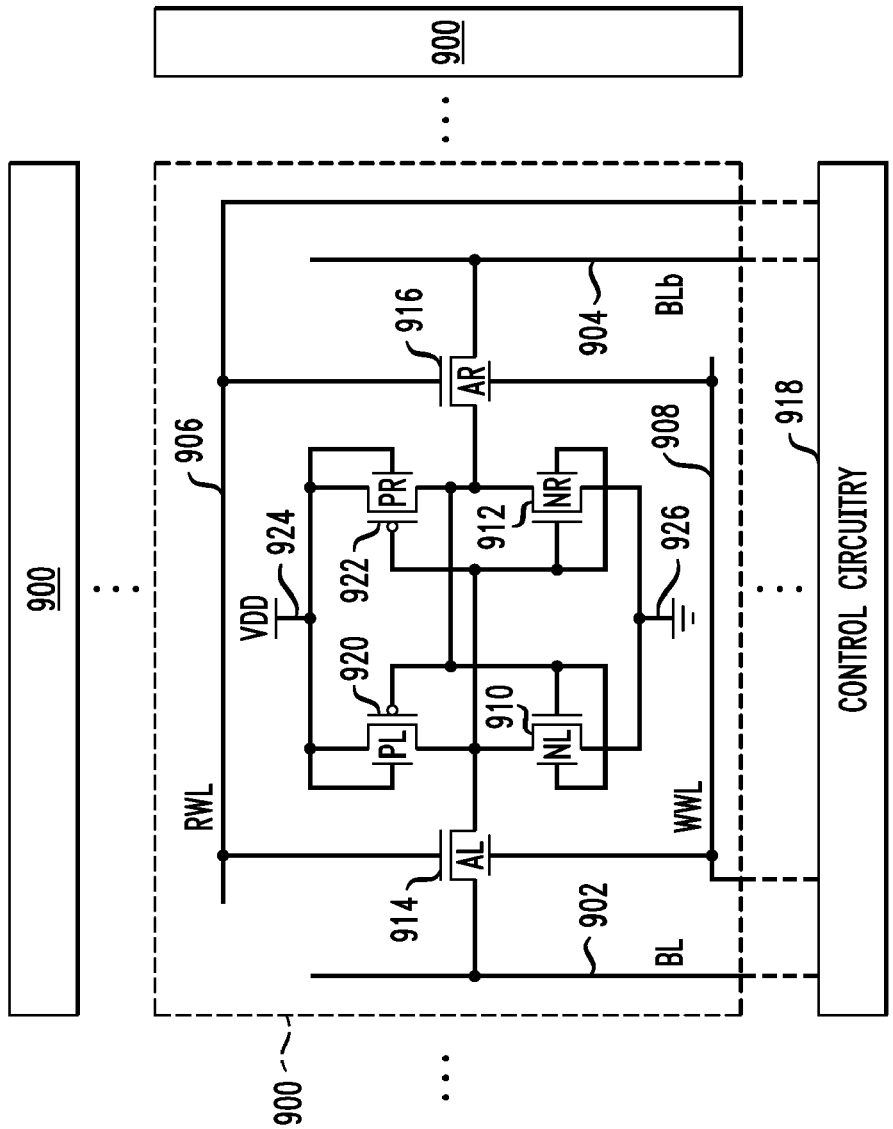
FIG. 9 shows an exemplary embodiments of a memory circuit using a first exemplary embodiment of a memory cell in accordance with an aspect of the invention.

It will be appreciated that the embodiment of FIG. 9 employs two separate word lines 906, 908 for each access device 914, 916. In order words, one additional (WRITE) word line (WWL) is added to a conventional SRAM cell by connecting the back gates of two access devices with WRITE word line 908. One gate of the access devices is connected to the READ word line 906 (RWL) and the other is connected to the WRITE word line 908 (WWL). In a READ operation, only RWL is "ON" (biased to VDD on RWL) and WWL is "OFF" (biased to 0 on WWL), thus weakening the strength of access devices 914, 916 (AR and AL) relative to pull-down devices 910, 912 (NL and NR) because AR and AL are operating in SG mode and NL and NR are operating in DG mode. In a WRITE operation, both RWL and WWL on "ON," thus strengthening devices 916, 918 (AL and AR) relative to pull-up devices 920, 922 (PL and PR).

Figure 10:
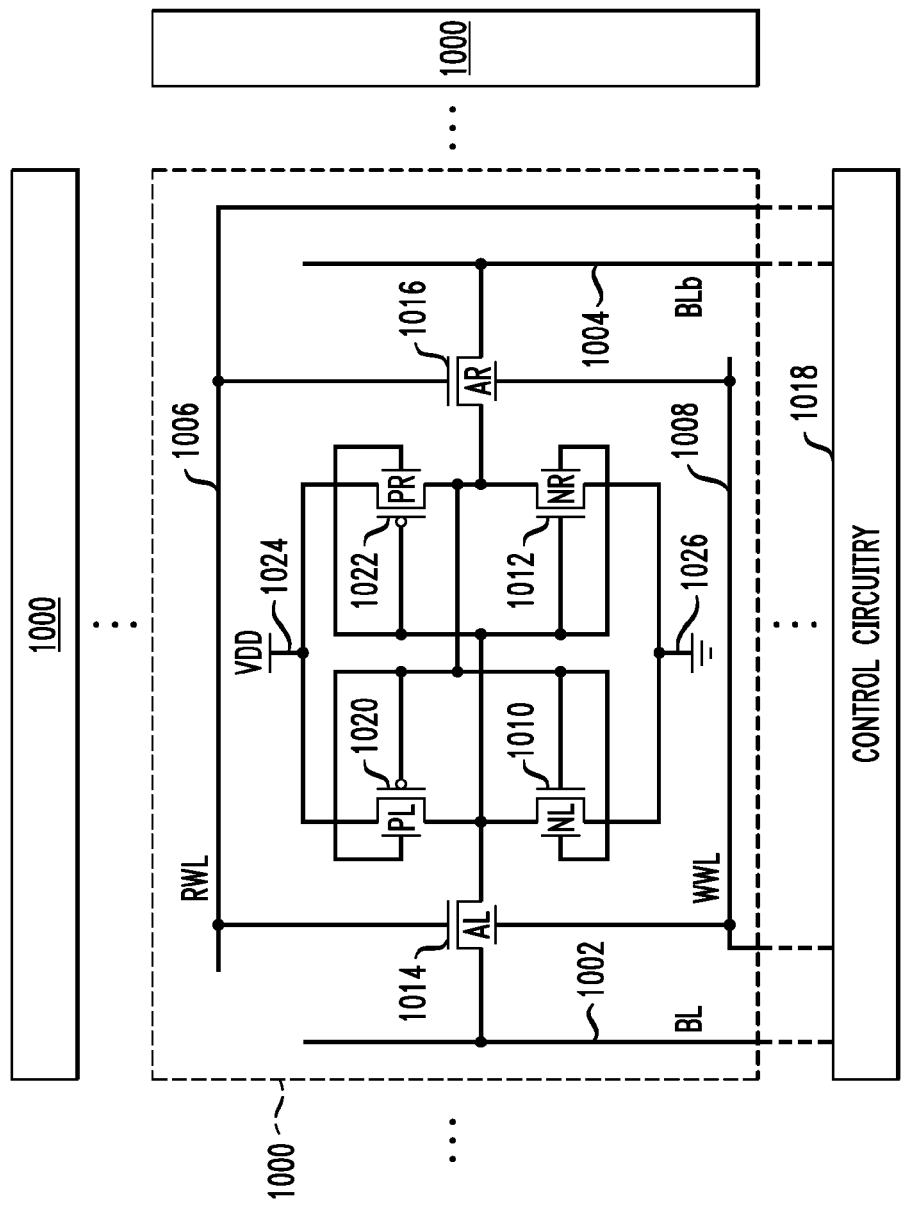
FIG. 10 shows an exemplary embodiment of a memory circuit using a second exemplary embodiment of a memory cell in accordance with an aspect of the invention.

Attention should now be directed to FIG. 10. Elements similar to those in FIG. 9 have received the same reference character incremented by one hundred, and will not be described again except to the extent they differ materially from those in FIG. 9. In the embodiment depicted, the first and second inverter pull-up devices 1020, 1022 are double-gate devices configured to operate in a double-gate mode during both the READ and WRITE operations. For example, the first inverter pull-up device 1020 can be a double-gate p-type field effect transistor (PFET) having electrically interconnected first and second gates, and the second inverter pull-up device 1022 can be a double-gate PFET having electrically interconnected first and second gates. The first inverter double-gate pull-up devices 1020 has a first drain-source terminal coupled to the supply voltage terminal 1024, and a second drain-source terminal coupled to the second drain-source terminal of the first access device 1014. The first and second gates of the first inverter pull-up device 1020 are coupled to the first and second gates of the first inverter double-gate pull-down device 1010. The second inverter double-gate pull-up device 1022 has a first drain-source terminal coupled to the supply voltage terminal 1024, and a second drain-source terminal coupled to the second drain-source terminal of the second access device 1016 and the gates of the first inverter pull-up device 1020. The first and second gates of the second inverter double-gate pull-up device 1022 are coupled to the first and second gates of the second inverter double-gate pull-down device 1012 and the second drain-source terminal of the first inverter pull-up device 1020.

It will be appreciated that the READ stability is increased in the example of FIG. 10, compared with FIG. 9. The pull-down devices 1020, 1022 (PL and PR) can be strengthened by connecting two gates for each device. In this case, PL and PR are operating in DG mode. Although a READ operation is most stable in the example of FIG. 10, the WRITE margin of the embodiment of FIG. 10 is lower than that of FIG. 9 and it would be the same as with a conventional scheme.

It should be emphasized that the embodiments of FIGS. 9 and 10 are exemplary in nature, and inventive cells and circuits can be implemented in many fashions; for example, with complementary polarities and device types.

Given the foregoing discussion, it will be apparent that a method of operating a memory circuit of the kind described can include the step of activating the READ word line 906, 1006 but not the WRITE word line 908, 1008 during a RED operation for a given one of the cells 900, 1000, so that the first and second access devices 914, 916, 1014, 1016 of the given one of the cells operate in a single-gate mode while the double-gate pull-down devices 910, 912, 1010, 1012 of the given one of the cells operate in a double gate mode. Further, another step can include activating both the READ word line 906, 1006 and the WRITE word line 908, 1008 during a WRITE operation for the given one of the cells 900, 1000, so that the first and second access devices 914, 916, 1014, 1016 of the given one of the cells 900, 1000 operate in a double-gate mode. The steps can be performed as needed, in any desired order. The step of activating the READ word line 906, 1006 but not the WRITE word line 908, 1008 during the READ operation can be performed to weaken the access devices 914, 916, 1014, 1016 relative to the pull-down devices 910, 912, 1010, 1012. The step of activating both the READ word line 906, 1006 and the WRITE word line 908, 1008 during the WRITE operation can be performed to strengthen the access devices 914, 916, 1014, 1016 relative to the pull-up devices 920, 922, 1020, 1022.

For circuits such as that of FIG. 10, an additional step can include operating the first and second inverter double-gate pull-up devices 1020, 1022 in a double-gate mode during at least the activating step associated with the READ operation, to enhance stability of the READ operation. Of course, as shown in the exemplary embodiment of FIG. 10, the gates are permanently connected so devices 1020, 1022 will always be in double-gate mode for READ and WRITE.

Figure 4:
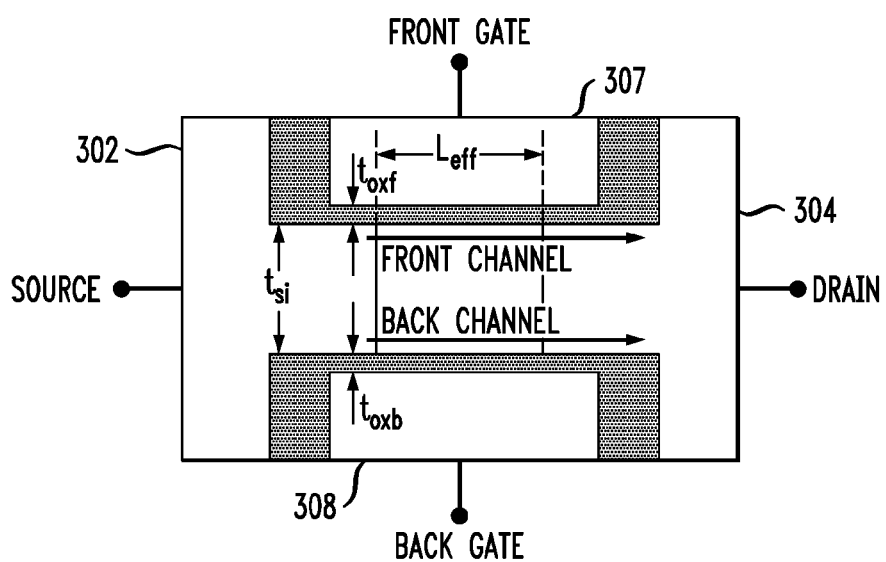
FIG. 4 shows a cross-sectional view of a prior art FinFET device.
Figure 5:
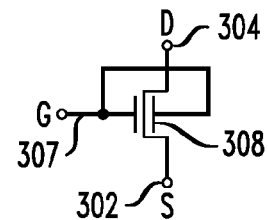
FIGS. 5 and 6 show tied gates and independent gates, respectively, for prior art double-gate FETs.
Figure 5:
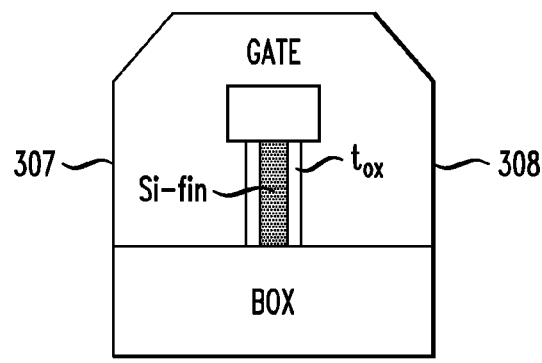
Figure 6:
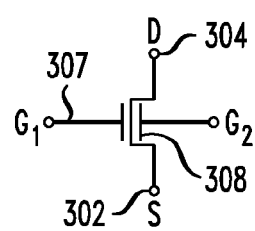
Figure 6:
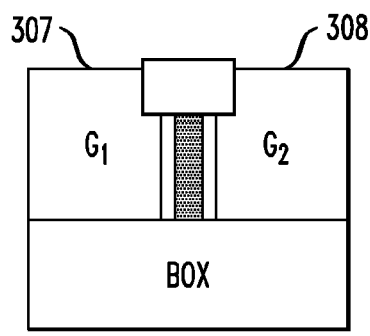
Figure 7:
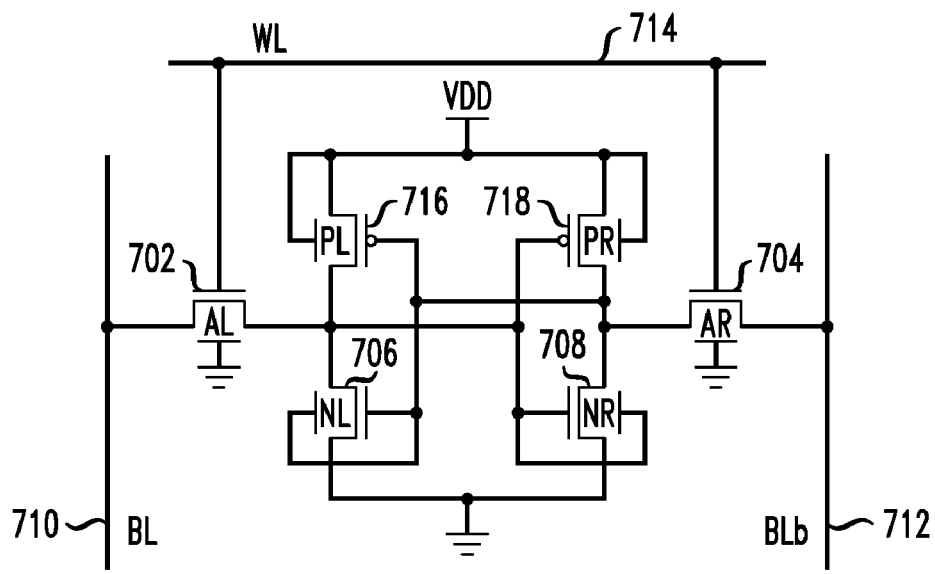
FIG. 7 shows a prior art "Yin-Yang" SRAM cell.
Figure 8:
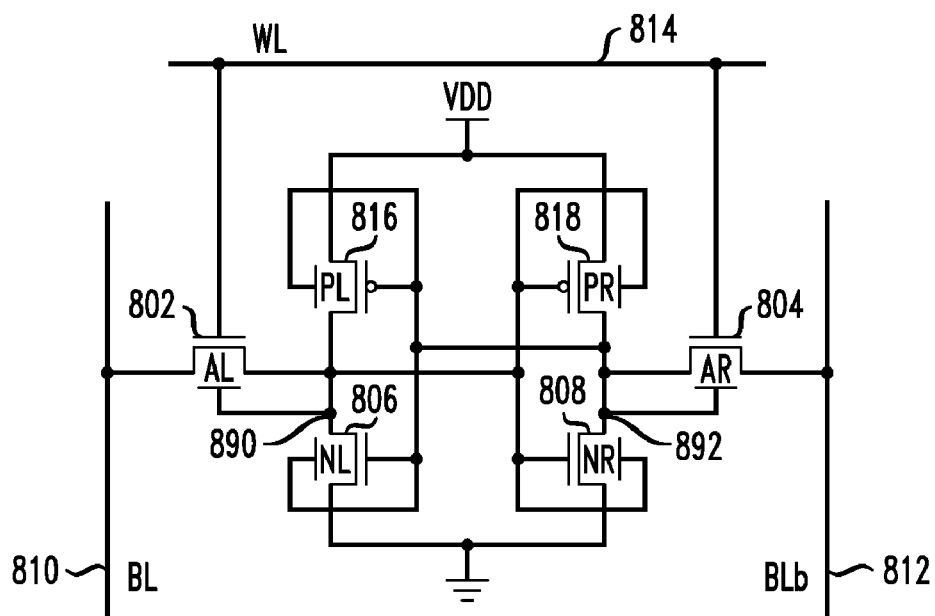
FIG. 8 shows another prior art SRAM cell, employing a back-gated design.
Figure 11:
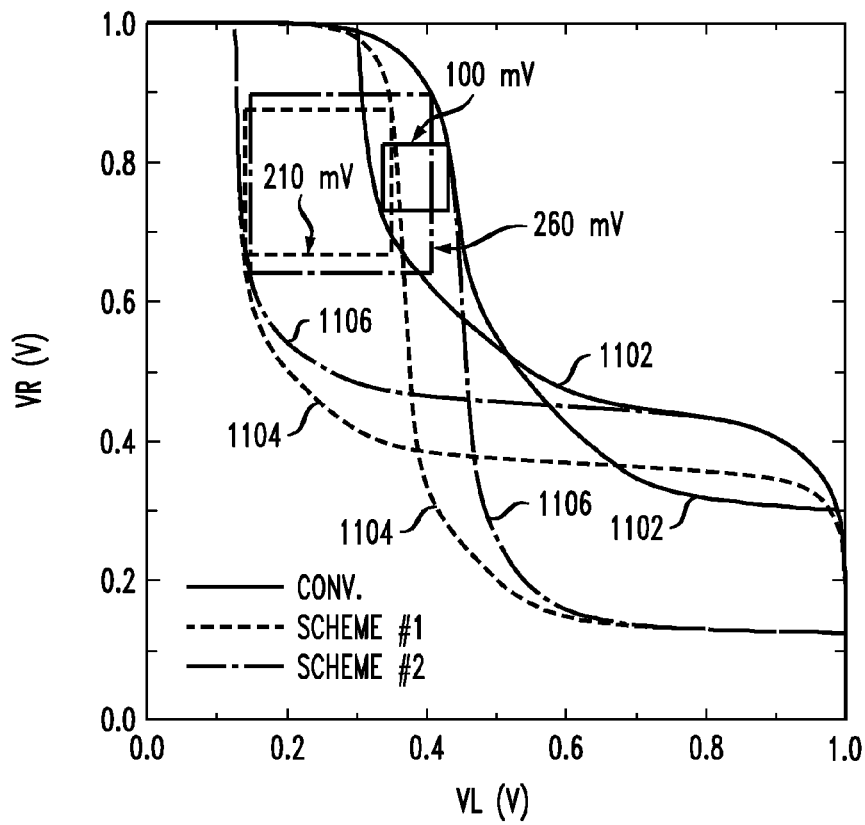
FIG. 11 shows predicted READ Static Noise Margins for conventional and proposed schemes.

FIG. 11 compares READ margins for particular instances of conventional 6T cells and the exemplary embodiments of FIGS. 9 and 10. MEDICI: 2-D Device Simulation, a mixmode device/circuit simulator available from Synopsys Inc., Mountain View, Calif. (http://www.synopsys.com/products/mixedsignal/taurus/device_sim_ds.html) was used, and FinFET devices were simulated, having a gate length of 25 nm, front-gate and back-gate thicknesses of 1 nm, and an undoped film thickness of 7 nm (parameters are depicted in FIG. 4). Note that all three schemes use a single fin-based FinFET device having Fin Height=50 nm; the actual device width is 0.1 um in DG mode (which is the minimum device width in state-of-art CMOS technology). As shown in FIG. 11, the conventional 6T cell (curve 1102) shows a very low READ margin of 100 mV in a single Fin-based design. In order to improve the READ margin, additional Fins would have to be used for pull-down devices, which significantly increases cell area. The inventive embodiments offer a more than twice higher READ SNM than the conventional scheme without increasing cell area. The Predicted READ SNM is 210 mV for the embodiment of FIG. 9 (curve 1104) and 260 mV for the embodiment of FIG. 11 (curve 1106).

Figure 12:
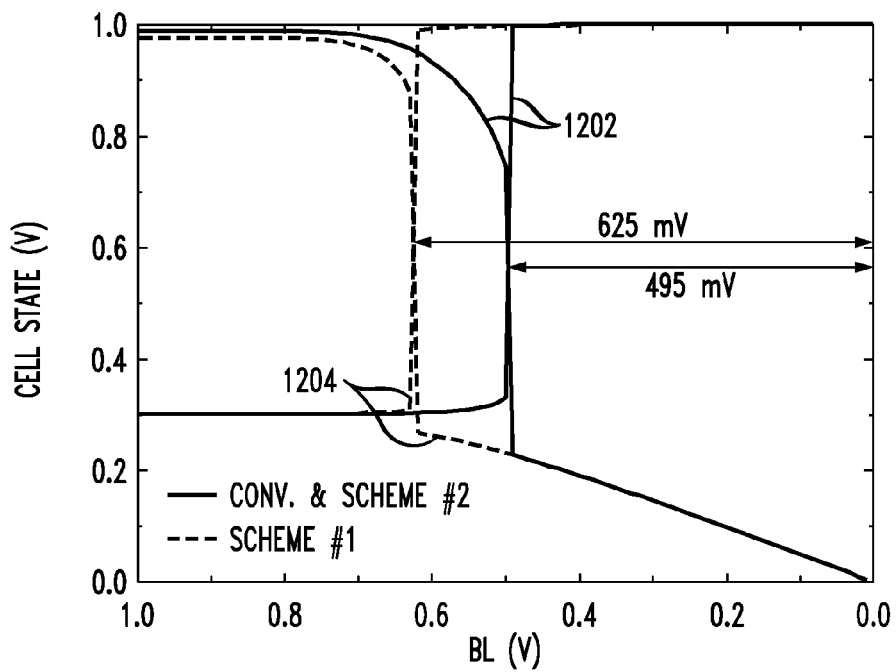
FIG. 12 shows predicted WRITE Margins for conventional and proposed schemes.

FIG. 12 shows MEDICI-predicted results of WRITE Margin wave forms for the exemplary embodiments, compared with a conventional scheme. The WRITE margin is defined as the maximum bit line (BL) voltage that can flip the cell state. It is observed that the same WRITE margin is predicted for the conventional and the embodiment of FIG. 10 (curve 1202), but the embodiment of FIG. 9 (curve 1204) offers a 26% higher WRITE margin.

It is be emphasized that the dimensions set forth in the examples of FIGS. 11 and 12 are exemplary and not limiting, and different dimensions can be used with the embodiments of FIGS. 9 and 10, or other embodiments; further, the indicated performance improvements are for the specific cases discussed and are not intended to limit the scope of the invention.

It will be appreciated that one or more inventive embodiments enable improved READ and/or WRITE margins by using two separate READ and WRITE word lines in a single FinFET access device. One or more of the following advantages may be achieved by one or more inventive embodiments:

(1) Improvements of READ and/or WRITE margins;
(2) Single Fin-based FinFET SRAM design with improved SRAM density;
(3) Applicable to many independent-gate controlled double-gate technologies including symmetrical and asymmetrical gates.

One or more inventive embodiments can be used in future FinFET technology where the READ/WRITE margins may be hard to manage due to process variations, and where high-density cells (or a single Fin for each device) are required.

Memory cells according to one more aspects of the invention may be formed into memory circuits, which may be realized as integrated circuits; thus, at least a portion of the techniques of one or more aspects or embodiments of the present invention described herein may be implemented in an integrated circuit. In forming integrated circuits, a plurality of identical die are typically fabricated in a repeated pattern on a surface of a semiconductor wafer. Each die can include one or more of the cells described herein, and may include other structures or circuits, or other types of cells. The individual die are cut or diced from the wafer, then packaged as an integrated circuit. A person of skill in the art will known how to dice wafers and package die to produce integrated circuits Integrated circuits so manufactured are considered part of the present invention.

Circuits including cells as described above can be part of the design for an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or signal processing devices as part of either (a) an intermediate product, such as a mother board, or (b) an end product. The end product can be any product that includes integrated circuit chips, ranging from toys and other low-end applications to advanced computer products having a display, a keyboard or other input device, and a central processor.

It will be appreciated and should be under stood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope of spirit of the invention.

What is claimed is:

1. A memory cell for interconnection with true and complementary bit lines and READ and WRITE word lines, said cell comprising:
   a first inverter having a first inverter double-gate pull-down device;
   a second inverter having a second inverter double-gate pull-down device, said second inverter being cross-coupled to said first inverter to form a storage flip-flop; and
   first and second access devices configured to selectively interconnect said cross-coupled inverters with the true and complementary bit lines, said first and second access devices being double-gate devices, each having a first gate connected to the READ word line and a second gate connected to the WRITE word line, wherein:
      during a READ operation, said first and second access devices are configured to operate in a single-gate mode with the READ word line "ON" and the WRITE word line "OFF" while said double-gate pull-down devices are configured to operate in a double gate mode; and
      during a WRITE operation, said first and second access devices are configured to operate in a double-gate mode with the READ word line "ON" and the WRITE word line also "ON".

2. The cell of claim 1, wherein said first and second access devices are configured to be relatively weakened with respect to said double-gate pull-down devices during said READ operation.

3. The cell of claim 1, wherein:
   said first inverter further comprises a first inverter pull-up device coupled to said first inverter double-gate pull-down device; and
   said second inverter further comprises a second inverter pull-up device coupled to said second inverter double-gate pull-down device.

4. The cell of claim 3, wherein said first and second access devices are configured to be relatively strengthened with respect to said pull-up devices during said WRITE operation.

5. The cell of claim 3, wherein:
   said first inverter double-gate pull-down device comprises an n-type field effect transistor (NFET) having electrically interconnected first and second gates;
   said first inverter pull-up device comprises a p-type field effect transistor (PFET);
   said second inverter double-gate pull-down device comprises an NFET having electrically interconnected first and second gates;
   said second inverter pull-up device comprises a PFET;
   said first and second access devices comprise double-gate NFETS; and
   said first and second inverter pull-down and pull-up devices and said first and second access devices all have a substantially similar device dimension.

6. The cell of claim 5, further configured for interconnection with a supply voltage and a ground, wherein:
   said first access device has a first drain-source terminal connected to the true bit line, and a second drain-source terminal;
   said first inverter pull-up device has a first drain-source terminal configured for coupling to the supply voltage, a second drain-source terminal coupled to said second drain-source terminal of said first access device, and at least one gate coupled to said first and second gates of said first inverter double-gate pull-down device;
   said first inverter double-gate pull-down device has a first drain-source terminal connected to said second drain-source terminal of said first inverter pull-up device and a second drain-source terminal configured for coupling to the ground;
   said second access device has a first drain-source terminal connected to the complementary bit line, and a second drain-source terminal;
   said second inverter pull-up device has a first drain-source terminal configured for coupling to the supply voltage, a second drain-source terminal coupled to said second drain-source terminal of said second access device and said at least one gate of said first inverter pull-up device, and at least one gate coupled to said first and second gates of said second inverter double-gate pull-down device and said second drain-source terminal of said first inverter pull-up device;
   said second inverter double-gate pull-down device has a first drain-source terminal connected to said second drain-source terminal of said second inverter pull-up device and a second drain-source terminal configured for coupling to the ground; and
   said first and second inverter pull-down and pull-up devices and said first and second access devices all comprises single-fin devices.

7. The cell of claim 4, wherein said first and second inverter pull-up devices comprise double-gate devices configured to operate in a double-gate mode during both said READ and WRITE operations.

8. The cell of claim 7, wherein:
   said first inverter double-gate pull-down device comprises an n-type field effect transistor (NFET) having electrically interconnected first and second gates;
   said first inverter double-gate pull-up device comprises a p-type field effect transistor (PFET) having electrically interconnected first and second gates;
   said second inverter double-gate pull-down device comprises an NFET having electrically interconnected first and second gates;
   said second inverter double-gate pull-up device comprises PFET having electrically interconnected first and second gates;
   said first and second access devices comprise double-gate NFETS; and
   said first and second inverter pull-down and pull-up devices and said first and second access devices all have a substantially similar device dimension.

9. The cell of claim 8, further configured for interconnection with a supply voltage and a ground, wherein:
   said first access device has a first drain-source terminal connected to the true bit line, and a second drain-source terminal;
   said first inverter double-gate pull-up device has a first drain-source terminal configured for coupling to the supply voltage, and a second drain-source terminal coupled to said second drain-source terminal of said first access device, said first and second gates of said first inverter double-gate pull-up device being coupled to said first and second gates of said first inverter double-gate pull-down device;
   said first inverter double-gate pull-down device has a first drain-source terminal connected to said second drain-source terminal of said first inverter double-gate pull-up device and a second drain-source terminal configured for coupling to the ground;

said second access device has a first drain-source terminal connected to the complementary bit line and a second drain-source terminal;

said second inverter double-gate pull-up device has a first drain-source terminal configured for coupling to the supply voltage, and a second drain-source terminal coupled to said second drain-source terminal of said second access device and said gates of said first inverter pull-up device, said first and second gates of said second inverter double-gate pull-up device being coupled to said first and second gates of said second inverter double-gate pull-down device and said second drain-source terminal of said first inverter pull-device;

said second inverter double-gate pull-down device has a first drain-source terminal connected to said second drain-source terminal of said second inverter double-gate pull-up device, and a second drain-source terminal configured for coupling to the ground; and said first and second inverter pull-down and pull-up devices and said first and second access devices all comprise single-fin devices.

10. A memory circuit comprising:

a plurality of bit lines structures, said bit line structures in turn comprising true and complementary bit lines;

a plurality of word lines structures, said word line structures in turn comprising READ and WRITE word lines, said word line structures intersecting said plurality of bit line structures to form a plurality of cell locations;

a plurality of cells located at said plurality of cell locations, each of said cells being selectively coupled to a corresponding one of said bit line structures under control of a corresponding one of said word line structures, each of said cells in turn comprising:

a first inverter having a first inverter double-gate pull-down device;

a second inverter having a second inverter double-gate pull-down device, said second inverter being cross-coupled to said first inverter to form a storage flip-flop; and first and second access devices configured to selectively interconnect said cross-coupled inverters with said true and complementary bit lines of a corresponding one of said word line structures, said first and second access devices being double-gate devices, each having a first gate connected to said READ word line and a second gate connected to said WRITE word line; and control circuitry connected to said bit line structures and said word line structures and configured to:

activate said READ word line but not said WRITE word line during a READ operation, so that said first and second access devices operate in a single-gate mode while said double-gate pull-down devices operate in a double gate mode; and activate both said READ word line and said WRITE word line during a WRITE operation, so that said first and second access devices operate in a double-gate mode.

11. The circuit of claim 10, wherein, in said cells:

said first inverter further comprises a first inverter pull-up device coupled to said first inverter double-gate pull-down device; and said second inverter further comprises a second inverter pull-up device coupled to said second inverter double-gate pull-down device.

12. The circuit of claim 11, wherein, in said cells:

said first inverter double-gate pull-down device comprises an n-type field effect transistor (NFET) having electrically interconnected first and second gates;

said first inverter pull-up device comprises a p-type field effect transistor (PFET);

said second inverter, double-gate pull-down device comprises an NFET having electrically interconnected first and second gates;

said second inverter pull-up device comprises a PFET;

said first and second access devices comprise double-gate NFETS; and said first and second inverter pull-down and pull-up devices and said first and second access devices all have a substantially similar device dimension.

13. The circuit of claim 12, further comprising a supply voltage terminal and a ground terminal, wherein, in said cells:

said first access device has a first drain-source terminal connected to the true bit line, and a second drain-source terminal;

said first inverter pull-up device has a first drain-source terminal coupled to the supply voltage terminal, a second drain-source terminal coupled to said second drain-source terminal of said first access device, and at least one gate coupled to said first and second gate of said first inverter double-gate pull-down device;

said first inverter double-gate pull-down device has a first drain-source terminal connected to said second drain-source terminal of said first inverter pull-up device and a second drain-source terminal coupled to said ground terminal;

said second access device has a first drain-source terminal connected to the complementary bit lines, and a second drain-source terminal;

said second inverter pull-up device has a first drain-source terminal coupled to said supply voltage terminal, a second drain-source terminal coupled to said second drain-source terminal of said second access device and said at least one gate of said first inverter pull-up device, and at least one gate coupled to said first and second gates of said second inverter double-gate pull-down device and said second drain-source terminal of said first inverter pull-up device;

said second inverter double-gate pull-down device has a first drain-source terminal connected to said second drain-source terminal of said second inverter pull-up device and a second drain-source terminal coupled to said ground terminal; and said first and second inverter pull-down and pull-up devices and said first and second access devices all comprise single-fin devices.

14. The circuit of claim 11, wherein, in said cells, said first and second inverter pull-up devices comprise double-gate devices configured to operate in a double-gate mode during both said READ and WRITE operations.

15. The circuit of claim 14, wherein, in said cells:

said first inverter double-gate pull-down device comprises an n-type field effect transistor (NFET) having electrically interconnected first and second gates;

said first inverter double-gate pull-up device comprises a p-type field effect transistor (PFET) having electrically interconnected first and second gates;

said second inverter double-gate pull-down device comprises an NFET having electrically interconnected first and second gates;

said second inverter double-gate pull-up device comprises a PFET having electrically interconnected first and second gates;

said first and second access devices comprise double-gate NFETS; and said first and second inverter pull-down and pull-up devices and said first and second access devices all have a substantially similar device dimension.

16. The circuit of claim 15, further comprising a supply voltage terminal and a ground terminal, wherein, said cells;

said first access device has a first drain-source terminal connected to the true bit line, and a second drain-source terminal;

said first inverter double-gate pull-up device has a first drain-source terminal coupled to said supply voltage terminal, and a second drain-source terminal coupled to said second drain-source terminal of said first access device, said first and second gates of said first inverter pull-up device being coupled to said first and second gates of said first inverter double-gate pull-down device;

said first inverter double-gate pull-down device has a first drain-source terminal connected to said second drain-source terminal of said first inverter double-gate pull-up device and a second drain-source terminal configured for coupling to said ground terminal;

said second access device has a first drain-source terminal connected to the complementary bit line and a second drain-source terminal;

said second inverter double-gate pull-up device has a first drain-source terminal coupled to said supply voltage terminal, and a second drain-source terminal coupled to said second drain-source terminal of said second access device and said gates of said first inverter pull-up device, said first and second gates of said second inverter double-gate pull-up device being coupled to said first and second gates of said second inverter double-gate pull-down device and said second drain-source terminal of said first inverter pull-up device;

said second inverter double-gate pull-down device has a first drain-source terminal connected to said second drain-source terminal of said second inverter double-gate pull-up device, and a second drain-source terminal coupled to said ground terminal; and said first and second inverter pull-down and pull-up devices and said first and second access devices all comprises single-fin devices.

* * * * *